United States Patent [19]
Suyama et al.

[11] Patent Number: 4,807,235
[45] Date of Patent: Feb. 21, 1989

[54] SEMICONDUCTOR LASER DEVICE

[75] Inventors: Takahiro Suyama; Kohsei Takahashi, both of Tenri; Saburo Yamamoto; Toshiro Hayakawa, both of Nara; Masafumi Kondo, Tenri, all of Japan

[73] Assignee: 501 Sharp Kabushiki Kaisha, Osaka, Japan

[21] Appl. No.: 905,516

[22] Filed: Sep. 9, 1986

[30] Foreign Application Priority Data

Sep. 11, 1985 [JP] Japan ............................ 60-201200

[51] Int. Cl.⁴ .................................................. H01S 3/19
[52] U.S. Cl. ........................................ 372/19; 372/32; 372/49
[58] Field of Search ................ 372/44, 49, 19, 29, 372/32, 45

[56] References Cited
FOREIGN PATENT DOCUMENTS
57-26488 2/1982 Japan .

OTHER PUBLICATIONS
Iga et al., "GaInAsP/InP DH Lasers With a Chemically Etched Facet", IEEE Journal of Quantum Electronics, vol. QE-16, No. 10, Oct. 1980, pp. 1044–1047.
J. Berger et al., *Appl. Phys. Lett.*, (5/85), 46:806–808.
R. R. Craig et al., *Electron. Lett.*, (2/85), 21:62–63.
S. Adachi et al., *J. Appl. Phys.*, (9/81), 52:5843–5845.
Y. L. Bessonov et al., *Sov. J. Quant. Elect.*, (2/79), 9:243–245.

*Primary Examiner*—James W. Davie
*Attorney, Agent, or Firm*—Ciotti & Murashige, Irell & Manella

[57] ABSTRACT

A semiconductor laser device comprising a multi-layered semiconductor crystal containing an active region for laser oscillation, wherein the extended portions of said active region which are adjacent to both sides of one facet having the width of a selected value of said device constitute light-absorbing regions by which light in a high-order transverse mode is absorbed to a greater extent than that in a fundamental transverse mode, thereby achieving laser oscillation in a stable fundamental transverse mode up to a high output power.

4 Claims, 2 Drawing Sheets

4,807,235

SEMICONDUCTOR LASER DEVICE

BACKGROUND OF THE INVENTION

1. Field of the Invention

This invention relates to an index guided semiconductor laser device.

2. Description of the Prior Art

In recent years, semiconductor laser devices have been widely used in compact disc players, video disc players, laser printers, optical disc files, etc. Semiconductor laser devices are mainly classified into two groups based on the optical waveguide mechanism, one of which is of a gain guided type and the other of which is of an index guided type. Gain guided semiconductor laser devices are inferior in that they produce an unstable transverse mode and bring about an astigmatism to a large extent, which causes difficulties in the attainment of the functions thereof or difficulties in the use thereof. On the other hand, index guided semiconductor laser devices are superior in practical use in that they produce a stable transverse mode and bring about no astigmatism.

Typical examples of index guided semiconductor laser devices are BH (buried hetero) lasers and VSIS (V-channeled substrate inner stripe) lasers. BH lasers are designed to bury the active region in semiconductor materials having a low refractive index, so that an index guided structure can be created based on a difference in the effective refractive index between the active region and the burying region. When the width of the active layer of the active region is set at a small value (about 2 $\mu$m or less), BH layers attain laser oscillation in a stable fundamental transverse mode at a low threshold current level. Moreover, astigmatism is not observed. However, BH lasers confine light within the active layer to an extremely large extent. Thus, in order to cut off high-order transverse modes, the width of the active layer must be made small, which causes difficulties in obtaining a wide area for light-emission and in the creation of high output power.

On the contrary, VSIS lasers are designed to form the active region on a substrate having a striped channel, so that an index guided structure can be formed by the effective refractive index difference based on a difference in light absorption between the region inside of the channel and the region outside of the channel. Since the effective refractive index difference depends upon the distance between the active layer and the substrate, when said distance is set to be small so as to attain laser oscillation in a stable fundamental transverse mode, the absorption of light in not only a high-order transverse mode but also a fundamental transverse mode becomes large, which causes difficulties in the creation of high output power. When the distance between the active layer and the substrate is made long so as to reduce light absorption, the fundamental transverse mode cannot be maintained at a stable level in a range in which high output power can be created.

As mentioned above, it is difficult to produce high output power with conventional BH lasers and conventional VSIS lasers cannot attain stable fundamental transverse mode oscillation in the high output power range.

SUMMARY OF THE INVENTION

The semiconductor laser device of this invention, which overcomes the above-discussed and numerous other disadvantages and deficiencies of the prior art, comprises a multi-layered semiconductor crystal containing an active region for laser oscillation, wherein the extended portions of said active region which are adjacent to both sides of one facet having the width of a selected value of said device constitute light-absorbing regions by which light in a high-order transverse mode is absorbed to a greater extent than that in a fundamental transverse mode, thereby achieving laser oscillation in a stable fundamental transverse mode up to a high output power.

Said facet has, in a preferred embodiment, a width of 3 $\mu$m or less.

Said facet is, in a preferred embodiment, formed by etching the center portion of one cavity facet of said laser device which has been formed by cleavage.

Thus, the invention described herein makes possible the object of providing an index guided semiconductor laser device in which light-absorbing regions for absorbing light in a high-order transverse mode are formed by the extended portions of the active region adjacent to both sides of one facet of this device, so that loss of light in a high-order transverse mode can be effectively attained, thereby achieving laser oscillation in a stable fundamental transverse mode up to a high output power.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The semiconductor laser device of this invention comprises light-absorbing regions in the resonance direction for the absorption of light in a high-order transverse mode, thereby suppressing a high-order transverse mode and attaining laser oscillation in a stable fundamental transverse mode. This semiconductor laser device is not provided with a light-absorbing layer on the substrate side or the opposite side with regard to the active layer.

More particularly, a center portion of one cavity facet of this laser device which has been formed by cleavage is removed by a chemical etching technique or a dry etching technique, resulting in a facet reflecting light in a fundamental transverse mode. The regions outside of this center portion removed by an etching technique function as light-absorbing regions, through which no current flows and which have a size which is larger than that of the spread of current to be injected into this semiconductor laser device. When the width of said facet formed by the etching technique is set to be a selected value, loss of light in a high-order transverse mode by the light-absorbing regions can be made larger than that in a fundamental transverse mode by the light-absorbing region so that laser oscillation in a stable fundamental transverse mode can be attained.

EXAMPLE

Figure 1:
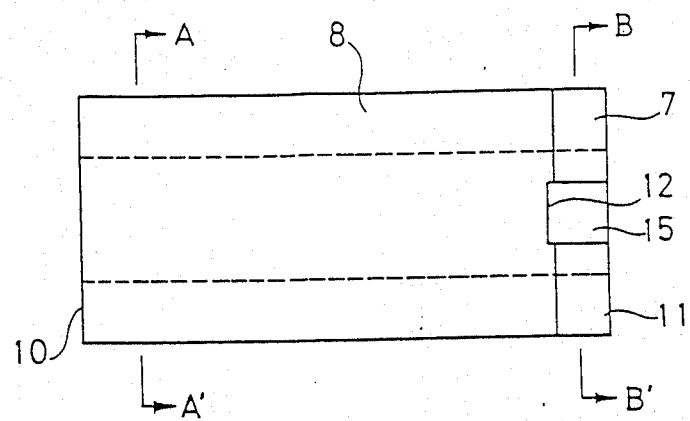
FIG. 1 is a plane view showing a semiconductor laser device of this invention.
Figure 2:
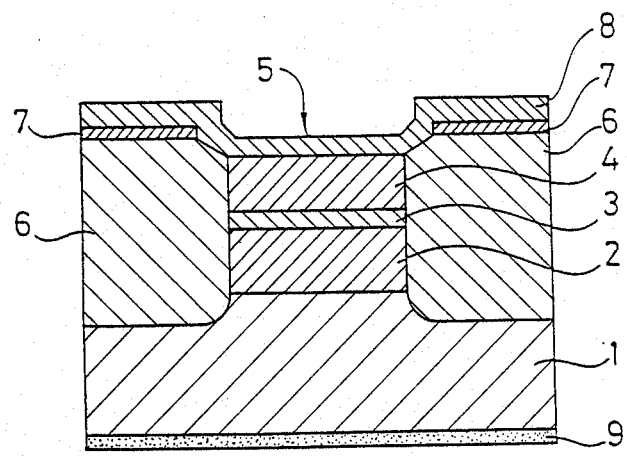
FIG. 2 is a side sectional view on line A—A' of the semiconductor laser device shown in FIG. 1.
Figure 3:
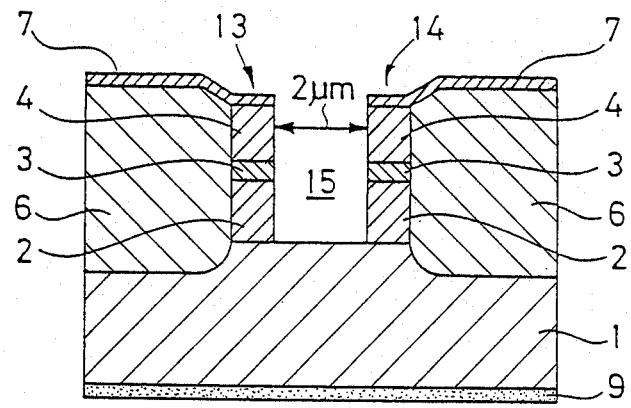
FIG. 3 is a side sectional view on line B—B' of the semiconductor laser device shown in FIG. 1.

FIGS. 1 to 3 show a buried type semiconductor laser device of this invention which is produced as follows: On an n-GaAs substrate 1, an n-$Ga_{1-x}Al_xAs$ (x=0.35) first cladding layer 2, a non-doped $Ga_{1-y}Al_yAs$ (y=0.05) active layer 3, and a p-$Ga_{1-x}Al_xAs$ (x=0.35) second cladding layer 4 are successively grown by liquid phase epitaxy. The resulting wafer is then subjected to an etching treatment with an etchant containing sulfuric acid so as to remove the areas outside of an active region 5 having a width of 5 μm in a manner to reach the substrate 1. Then, an n-$Ga_{1-z}Al_zAs$ (z=0.45) burying layer 6 is grown outside of the active region 5 by liquid phase epitaxy. Then, by chemical vapor deposition, an insulating layer 7 is formed on the active region 5 and the burying layer 6 grown outside of the active layer 5. Then, the striped portion of the insulating layer 7 positioned on the active layer 5 is removed by photolithography. A p-sided electrode 8 and an n-sided electrode 9 are then formed on the upper face of the wafer and the back face of the substrate 1, respectively.

The center portion 15 (the width thereof being 2 μm and the length thereof being 20 μm) of the active layer 5, which is positioned at the right side in FIG. 1, is then removed by a reactive ion beam etching technique in a manner to reach the substrate 1 as shown in FIG. 3, resulting in a facet 12 (FIG. 1) having a width of 2 μm. The extended portions 13 and 14 of the active region 5 which are adjacent to said facet 12 constitute light-absorbing regions. As shown in FIGS. 1 and 3, the portion of the p-sided electrode 8 is extended to neither the surface areas of the light-absorbing regions 13 and 14, which are positioned on both sides of the space region 15, nor the surface area of the burying layer 6, but the insulatig layer 7 alone is extended to both the surface areas of the light-absorbing regions 13 and 14 and the surface area of the burying layer 6. The width of the facet 12 is preferably 3 μm or less.

The semiconductor laser device obtained by the above-mentioned process has a cavity between the facets 10 and 12. When DC current is injected into this laser device through the p-sided electrode 8 and the n-sided electrode 9, laser oscillation is attained. The amount of light distributed into the light-absorbing regions 13 and 14 in a high-order transverse mode is greater than that of light distributed into the light-absorbing regions 13 and 14 in a fundamental transverse mode, so that loss of light in the high-order transverse mode by the light-absorbing regions 13 and 14 becomes greater than that in the fundamental transverse mode by the light-absorbing regions 13 and 14, resulting in stable laser oscillation in a fundamental transverse mode.

Although the facet 12 of the semiconductor laser device of the above-mentioned example has a width of as narrow as 2 μm, the width of the cavity of this semiconductor laser device can be as wide as 5 μm so that laser oscillation can be attained in a stable fundamental transverse mode up to a high output power of 80 μm. Moreover, since the fundamental structure of this semiconductor laser device is of a buried type, the astigmatism arising in this laser device is as small as 5 μm or less at an optical output power of 80 mW, which is desirable in practical use.

The above-mentioned example dislcosed only a buried type semiconductor laser device, but this invention is, of course, applicable to semiconductor laser devices having other fundamental structures.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a multi-layered semiconductor crystal containing an active region for laser oscillation, a first cavity facet, and a second cavity facet, the device wherein said first facet has a recessed portion constituting a recessed facet, said recessed facet having a width less than the width of said active region, and said recessed facet being positioned such that portions of said active region extend past said recessed facet on both sides of said recessed facet to said first cavity facet to form extended portions, said extended portions constituting light-absorbing regions by which light in a high-order transverse mode is absorbed to a greater extent than that in a fundamental transverse mode, thereby achieving laser oscillation in a stable fundamental transverse mode up to a high output power.

2. A semiconductor laser device according to claim 1, wherein said recessed facet has a width of 3 μm or less.

3. A semiconductor laser device according to claim 1, wherein said recessed facet is formed by etching the center portion of said first cavity facet of said laser device which has been formed by cleavage.

4. A semiconductor laser device according to claim 2, wherein said recessed facet is formed by etching the center portion of said first cavity facet of said laser device which has been formed by cleavage.

* * * * *